United States Patent
Voerckel

(10) Patent No.: US 9,520,325 B2
(45) Date of Patent: Dec. 13, 2016

(54) METHODS FOR PRODUCING SEMICONDUCTOR DEVICES

(71) Applicant: Infineon Technologies Austria AG, Villach (AT)

(72) Inventor: Andreas Voerckel, Villach (AT)

(73) Assignee: INFINEON TECHNOLOGIES AUSTRIA AG, Villach (AT)

(*) Notice: Subject to any disclaimer, the term of this patent is extended or adjusted under 35 U.S.C. 154(b) by 28 days.

(21) Appl. No.: 13/947,135

(22) Filed: Jul. 22, 2013

(65) Prior Publication Data
US 2015/0024550 A1 Jan. 22, 2015

(51) Int. Cl.
| H01L 23/32 | (2006.01) |
| H01L 21/82 | (2006.01) |
| H01L 21/56 | (2006.01) |
| H01L 21/768 | (2006.01) |
| H01L 23/00 | (2006.01) |

(52) U.S. Cl.
CPC ............ *H01L 21/82* (2013.01); *H01L 21/56* (2013.01); *H01L 21/76838* (2013.01); *H01L 23/32* (2013.01); *H01L 24/83* (2013.01); *H01L 21/568* (2013.01); *H01L 2224/32245* (2013.01); *H01L 2224/83005* (2013.01); *H01L 2924/12042* (2013.01); *H01L 2924/1301* (2013.01); *H01L 2924/1305* (2013.01); *H01L 2924/13055* (2013.01); *H01L 2924/181* (2013.01)

(58) Field of Classification Search
CPC .................................................. H01L 21/02035
See application file for complete search history.

(56) References Cited

U.S. PATENT DOCUMENTS

| 2006/0166390 A1* | 7/2006 | Letertre et al. ................. 438/34 |
| 2009/0017566 A1 | 1/2009 | Basin et al. |
| 2010/0230711 A1* | 9/2010 | Kuo et al. ........................ 257/99 |
| 2012/0083098 A1 | 4/2012 | Berger et al. |
| 2012/0217527 A1* | 8/2012 | Ito ............................ H01L 33/46 257/98 |
| 2012/0319249 A1* | 12/2012 | Uchida ................. H01L 29/045 257/628 |
| 2013/0256864 A1* | 10/2013 | Nagano .................. H01L 23/48 257/690 |

* cited by examiner

*Primary Examiner* — Cheung Lee

(57) ABSTRACT

A method for producing a semiconductor device in accordance with various embodiments may include providing a semiconductor workpiece attached to a first carrier; dicing the semiconductor workpiece and the carrier so as to form at least one individual semiconductor chip; mounting the at least one semiconductor chip with a side facing away from the carrier, to an additional carrier.

11 Claims, 14 Drawing Sheets

METHODS FOR PRODUCING SEMICONDUCTOR DEVICES

TECHNICAL FIELD

Various embodiments relate to a method for producing a semiconductor device.

BACKGROUND

For semiconductor chips and devices, semiconductor substrates can often be a source of ohmic losses and thermal resistance. Moreover some semiconductor substrates can be susceptible to handling breakage, or have limiting process tolerances for semiconductor manufacturing. Therefore methods for manufacturing semiconductor devices having substrates with dimensions that can be optimized for device performance without the aforementioned disadvantages may be desirable.

SUMMARY

A method for producing a semiconductor device in accordance with various embodiments may include providing a semiconductor workpiece attached to a carrier; dicing the semiconductor workpiece and the carrier so as to form at least one individual semiconductor chip; mounting the at least one semiconductor chip with a side facing away from the carrier, to an additional carrier.

A method for producing a semiconductor device in accordance with various embodiments may include providing a semiconductor workpiece having a carrier attached to a first side of the semiconductor workpiece and having a metal layer applied to a second side of the semiconductor workpiece; forming at least one metal block over the metal layer; and forming an encapsulation layer over at least one of the metal layer and the at least one metal block to at least partially encapsulate the at least one metal block.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
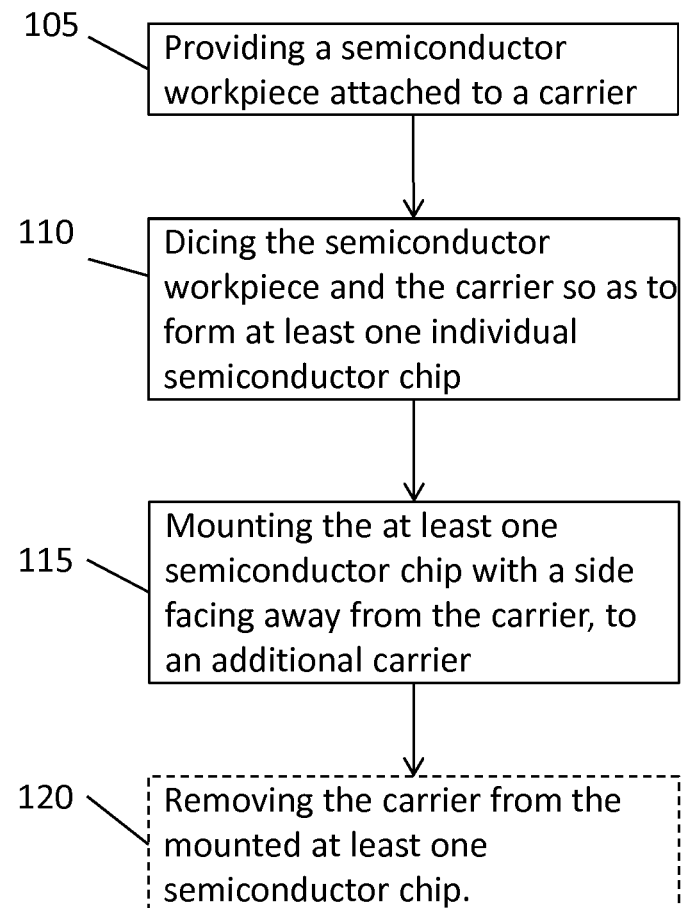
FIG. 1 shows a method for producing a semiconductor device in accordance with various embodiments.

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, etc.

The term "a plurality" may be understood to include any integer number greater than or equal to two, i.e. two, three, four, five, etc.

The word "over", used herein to describe forming a feature, e.g. a layer, "over" a side or surface, may be used to mean that the feature, e.g. the layer, may be formed "directly on", e.g. in direct contact with, the implied side or surface. The word "over", used herein to describe forming a feature, e.g. a layer, "over" a side or surface, may be used to mean that the feature, e.g. the layer, may be formed "indirectly on" the implied side or surface with one or more additional layers being arranged between the implied side or surface and the formed layer.

The term "connection" may include both an indirect "connection" and a direct "connection".

When referring to semiconductor devices, at least two-terminal devices are meant, an example is a diode. Semiconductor devices can also be three-terminal devices such as transistors, e.g., field-effect transistors (FET), insulated gate bipolar transistors (IGBT), junction field effect transistors (JFET), and thyristors to name a few. The semiconductor devices can also include more than three terminals. According to an embodiment, semiconductor devices are power devices. According to one or more embodiments, semiconductor devices may include or may be integrated circuits which may include a plurality of integrated devices.

Exemplary embodiments described herein pertain to, without being limited thereto, semiconductors devices including at least one semiconductor substrate layer that are manufactured with the use of an artificial, replacement, or temporary substrate.

In exemplary embodiments, semiconductor devices can include at least one thin semiconductor layer. Manufacturing semiconductor chips or devices that include thin semiconductor layers can result in improved electrical and/or thermal properties or characteristics.

In embodiments, the use of temporary substrates or carriers can facilitate the manufacture of semiconductor devices by providing stability to one or more layers and help reduce or eliminate substrate related parasitics.

In accordance with exemplary embodiments, layer transfer techniques can be used in conjunction with the use of artificial or temporary carriers. One known process is the SMART Cut technique. This process and/or other layer transfer techniques can be used for providing a substrate layer, such as a thin substrate disposed on a carrier or other suitable layer. The SMART Cut technique may be used since it allows for the repeated or multiple-use of a substrate. The SMART Cut technique will be discussed briefly later.

FIG. 1 shows according to exemplary embodiments, a method for producing a semiconductor device. FIGS. 2A-2D illustrate an exemplary process involving a semiconductor workpiece in accordance with one or more embodiments of FIG. 1.

Referring to FIG. 1, at 105, a semiconductor workpiece attached to a carrier is provided. The semiconductor workpiece may include one or more layers including semiconductor layers, metal layers, device layers, etc. In this regard, the workpiece may contain one or more active regions that each may contain or form an integrated circuit.

In accordance with exemplary embodiments, the workpiece may include a semiconductor layer. Such a semiconductor layer may have thicknesses of less than or equal to 100 μm, including for example, in the ranges of 20 nm to 2 μm, 2 μm to 5 μm, 5 μm to 10 μm, 5 μm to 15 μm, 15 μm to 100 μm, and 1 μm to 100 μm, to name a few.

The substrate or semiconductor layer of the provided semiconductor workpiece can be made of any suitable semiconductor materials. Examples of such materials include, without being limited thereto, elementary semiconductor materials such as silicon (Si), Germanium (Ge) group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminum gallium nitride (AlGaN), indium gallium phosphide (InGaPa) or indium gallium arsenide phosphide (In—GaAsP), and binary or ternary II-VI semiconductor materials such as cadmium telluride (CdTe) and mercury cadmium telluride (HgCdTe) to name a few. For example for power semiconductor applications materials such as Si, SiC and GaN materials may be used.

In accordance with exemplary embodiments, the workpiece may include a device layer in addition to the semiconductor layer. The device layer may be epitaxially formed on the semiconductor layer. In some embodiments, the semiconductor layer may have a higher doping concentration than the device layer, and/or may be made of a semiconductor material different from the device layer. In some embodiments, the device layer may include one or more semiconductor devices.

Figure 2A:
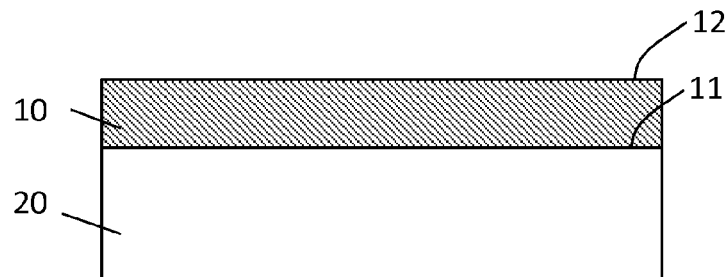
FIGS. 2A-2D show various views illustrating a process involving a semiconductor workpiece in accordance with various embodiments.

FIG. 2A depicts a cross sectional view of a semiconductor workpiece 10 attached to a carrier 20. The workpiece 10 may be attached to the carrier 20 with a side 11, which may e.g., be a front side of the workpiece 10. The carrier 20 can be made of any suitable materials for supporting the workpiece 10, such as glass, plastic, metal, etc.

Figure 2B:
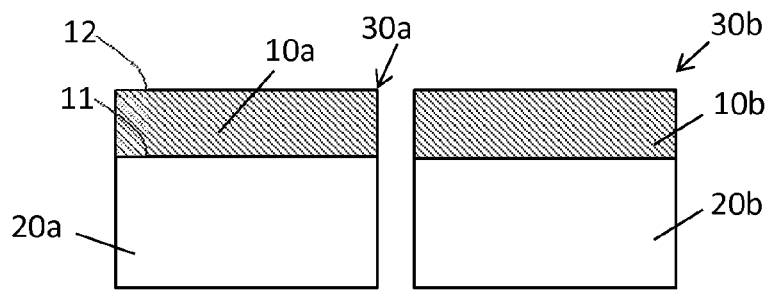

In FIG. 1, at 110, the semiconductor workpiece and the attached carrier are diced to form at least one individual semiconductor chip. The semiconductor chip may include or consist of an integrated circuit. In exemplary embodiments dicing may occur along kerf regions or other appropriate regions that can separate various chip regions and integrated circuits that are formed on the workpiece. FIG. 2B shows an embodiment, where the workpiece 10 and the carrier 20 have been diced so as to form two individual and separated semiconductor chips, 30a and 30b. After dicing, chip 30a may include workpiece 10a, which may correspond to a first portion of workpiece 10, wherein workpiece 10a may be attached to carrier 20a, which may correspond to a first portion carrier 20, and chip 30b may include workpiece 10b, which may correspond to a second portion of workpiece 10, wherein workpiece 10b may be attached to carrier 20b, which may correspond to a second portion of carrier 20. In accordance with exemplary embodiments, dicing may be performed using any suitable technique such as sawing, plasma dicing, laser dicing, stealth dicing, or the like.

Figure 2C:
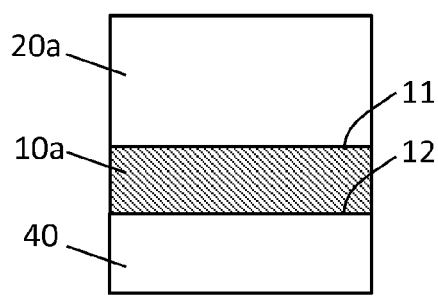

After dicing, FIG. 1 indicates at 115, that the at least one semiconductor chip formed from dicing can be mounted to an additional carrier. In this regard the side of the workpiece of the semiconductor chip not attached to the carrier can be mounted or attached to the additional carrier. FIG. 2C shows one embodiment in which the semiconductor chip 30a has been mounted on an additional carrier 40. As shown, a side 12 of the workpiece 10, for example the back side or side facing away from the carrier, has been attached to the additional carrier 40.

Carriers, e.g., carrier wafers or carrier layers described herein, including carrier 20, can include any suitable materials such as, for example, glass, graphite, and plastic, to name a few. Additionally, carrier 20 as well as any other carrier wafer or carrier layer described herein, may be an electrically conductive carrier, such as, for example, a metal carrier, a metal plate, a copper plate, an aluminum plate, a copper wafer, an aluminum wafer, and the like, to name a few. In accordance with exemplary embodiments, carrier wafers described herein may provide mechanical stability that may prevent or reduce incidents of breakage of, including, for example, thin or fragile layers, among others.

In the case of embodiment of FIG. 2C, the carrier 20a can remain attached to the workpiece 10a after mounting. The carrier 20a, among other things, may serve as an electrical contact and/or provide thermal coupling (heat sink).

Figure 2D:
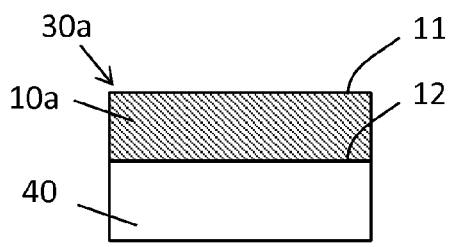

Optionally, at 120 of FIG. 1 the carrier can be removed after mounting. In this regard, FIG. 2D shows an embodiment in which the carrier 20a has been removed from the workpiece 10a. In the resulting structure the semiconductor chip 30a is mounted on the additional carrier 40 with the front side of the chip 10a exposed (e.g., the front side of workpiece 10a is exposed).

In accordance with exemplary embodiments, the additional carrier 40 to which the semiconductor chip 30a has been mounted can be an electrically conductive carrier, e.g., a lead frame.

Figure 3:
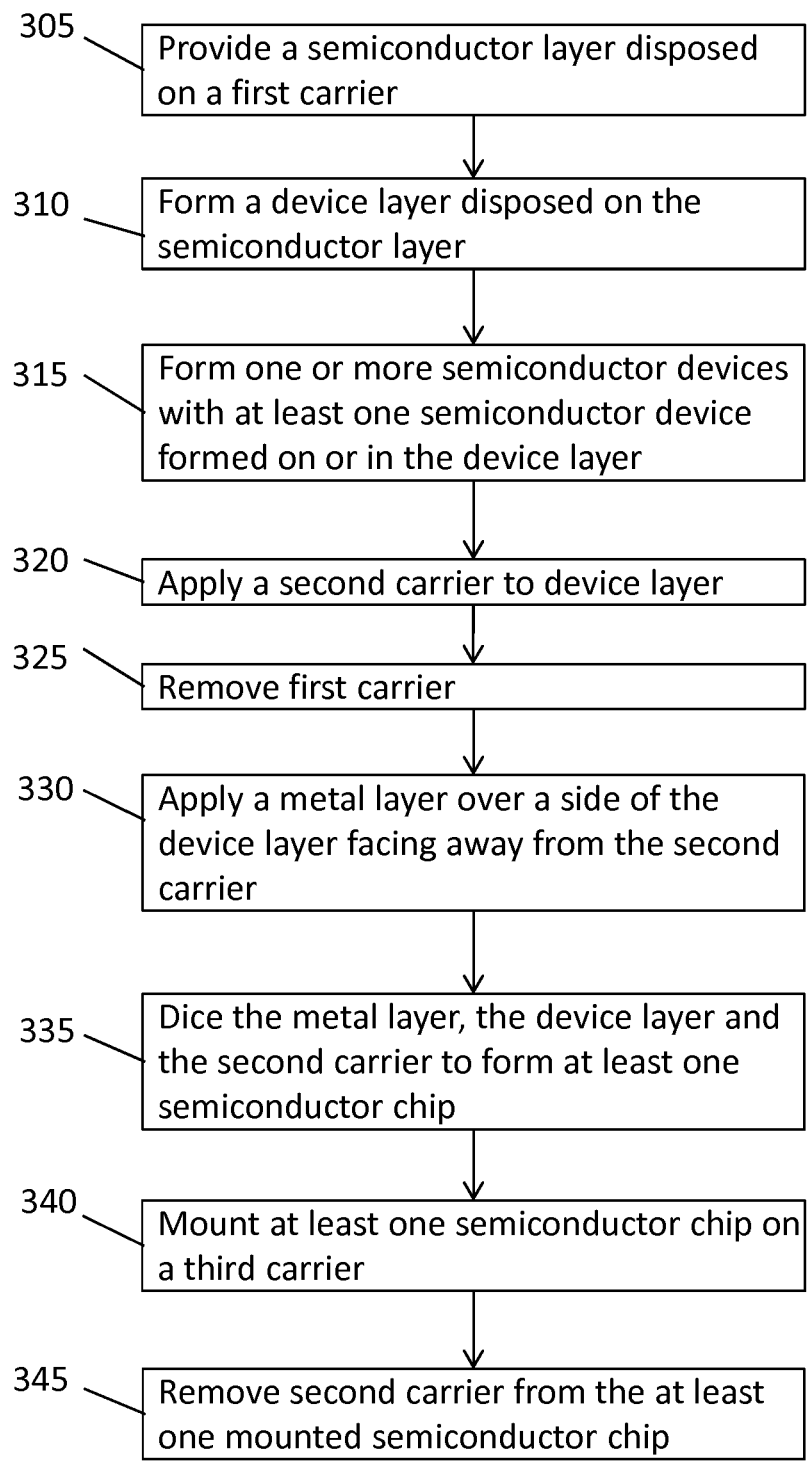
FIG. 3 shows a method for producing a semiconductor device in accordance with various embodiments.

FIG. 3 shows according to exemplary embodiments, a method for producing a semiconductor device. FIGS. 4A-4I illustrate an exemplary process involving a semiconductor workpiece in accordance with one or more embodiments of FIG. 3.

Figure 4A:
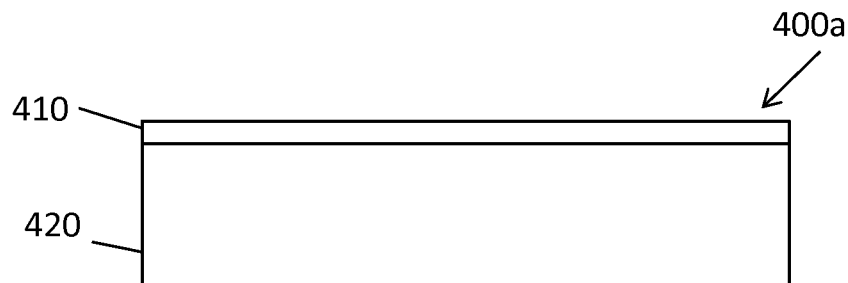
FIGS. 4A-4I show various views illustrating a process involving a semiconductor workpiece in accordance with various embodiments.

Referring to FIG. 3, at 305, a semiconductor layer disposed on, e.g., attached to a first carrier may be provided. In some embodiments, the semiconductor layer may be considered a thin semiconductor layer or substrate. FIG. 4A depicts a cross sectional view of a semiconductor structure 400a showing thin substrate layer 410 disposed or bonded on a front side of a carrier wafer 420. The thickness of the thin layer 410 can be defined or measured vertically from the backside of the thin layer 410 (which is in contact with the front side of the carrier wafer 420) to the front side or front surface of the thin layer 410. In accordance with exemplary embodiments, the thin layer can have a thickness in the ranges of 20 nm to 2 μm, 2 μm to 5 μm, 5 μm to 10 μm, 5 μm to 15 μm, 1 μm to 100 μm, to name a few. Similarly, the carrier 420 or carrier layer can have a thickness in the ranges of 100 µm to 1 mm, 100 µm to 300 µm, 300 µm to 500 µm, 500 µm to 1 mm, to name a few. While various embodiments herein describe a semiconductor workpiece or structure having a thin layer or thin semiconductor substrate/wafer, this is not necessarily so. In other words, provided semiconductor structures can have semiconductor layers with other thicknesses, including, for example, greater thickness sizes.

The thin layer 410 can be made of any suitable semiconductor materials. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminum gallium nitride (AlGaN), indium gallium phosphide (InGaPa) or indium gallium arsenide phosphide (In—GaAsP), and binary or ternary II-VI semiconductor materials such as cadmium telluride (CdTe) and mercury cadmium telluride (HgCdTe), to name a few. For example for power semiconductor applications materials such as Si, SiC and GaN materials may be used.

Carrier wafers or carrier layers described herein, including carrier wafer 420, can include any suitable materials such as, for example, glass or graphite, to name a few. In accordance with exemplary embodiments, carrier wafers described herein may provide mechanical stability that may prevent or reduce incidents of breakage of, including, for example, thin or fragile layers, among others.

Figure 4B:
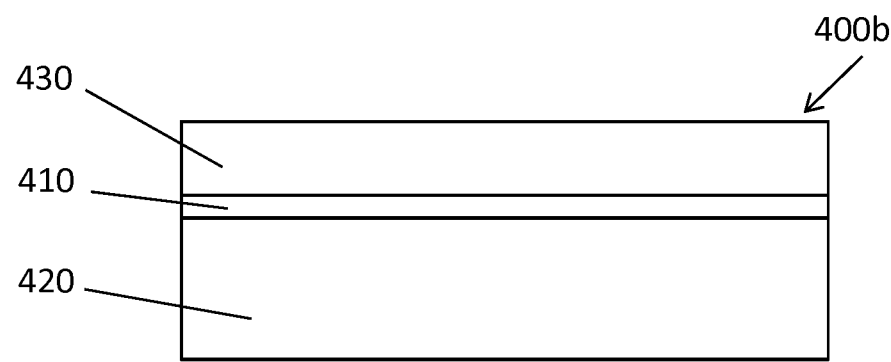

As shown in FIG. 3, at 310 a device layer can be formed on a side of the semiconductor layer. For example the embodiment of FIG. 4B shows structure 400b that includes a device layer 430 which has been formed or disposed on a front side of the thin layer 410. The thin layer 410 may serve as a starting layer for the epitaxial growth of device layer 430.

In various embodiments, the device layer can be an epitaxial layer. For example, the device layer 430 can be epitaxially formed on the front side of the thin layer 410. In accordance with various embodiments, the device layer 430 may be made of the same or different materials from the thin layer 410. In one example, the thin layer 410 and the device layer 430 can both be made out of silicon, silicon carbide, or any other appropriate materials.

Further, while the device layer 430 and the thin layer 410 can be of the same or different materials, the doping concentrations of each layer may also be the same or differ. In another example, the thin layer 410 can have a higher or greater doping concentration than the device layer 430. Epitaxially forming the device layer 430 on a higher doped thin layer 410 can allow for the tailoring or targeting desired doping concentration in the device layer 430.

Figure 4C:
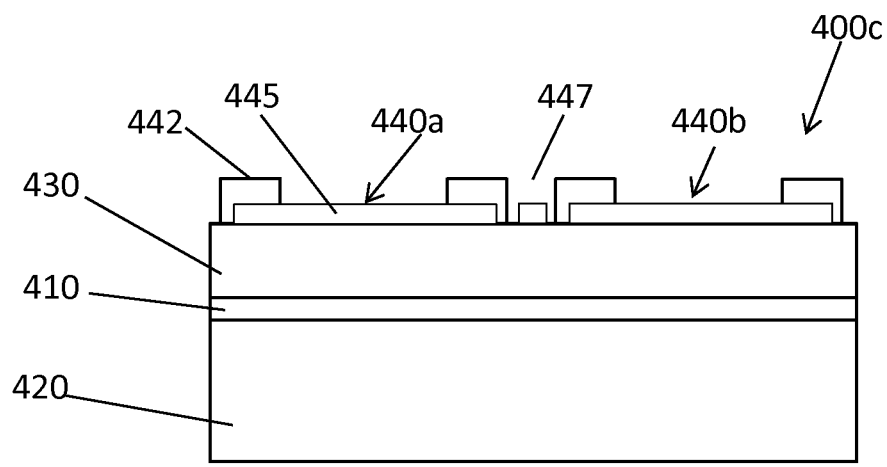

Referring back to FIG. 3, at 315, one or more semiconductor devices can be formed on and/or in the device layer. FIG. 4C shows, for example, a plurality of semiconductor devices, represented by 440a and 440b, located on the device layer 430 in structure 400c.

In various embodiments, semiconductor devices such as 440a and 440b can be fabricated with any other suitable and/or necessary elements such as, in the embodiment of FIG. 4C, the structure 400c can include metallization layers 445 (e.g., frontside metallizations), passivation layers 442 (e.g., imides), kerf regions 447, and the like, to name a few. The semiconductor devices 440a, 440b can be fabricated or formed using any suitable semiconductor manufacturing techniques. Generally, the devices can be any kind or type of semiconductor device, e.g., transistors, diodes, and thyristors, to name a few.

In FIG. 3, at 320, after fabricating one or more semiconductor devices, a second carrier is applied to the device layer. Referring to the embodiment of FIG. 4D, in structure 400d, a second carrier 450 is attached to a front or exposed side of the device layer 430. The carrier 450 overlies at least the semiconductor devices 440a, 440b.

As a result of applying a second carrier, such as carrier 450, the resulting structure has enhanced or additional mechanical stability. The second carrier 450, as with the first carrier 420, can be made of any suitable material, such as glass, graphite, and plastic, to name a few.

Figure 4D:
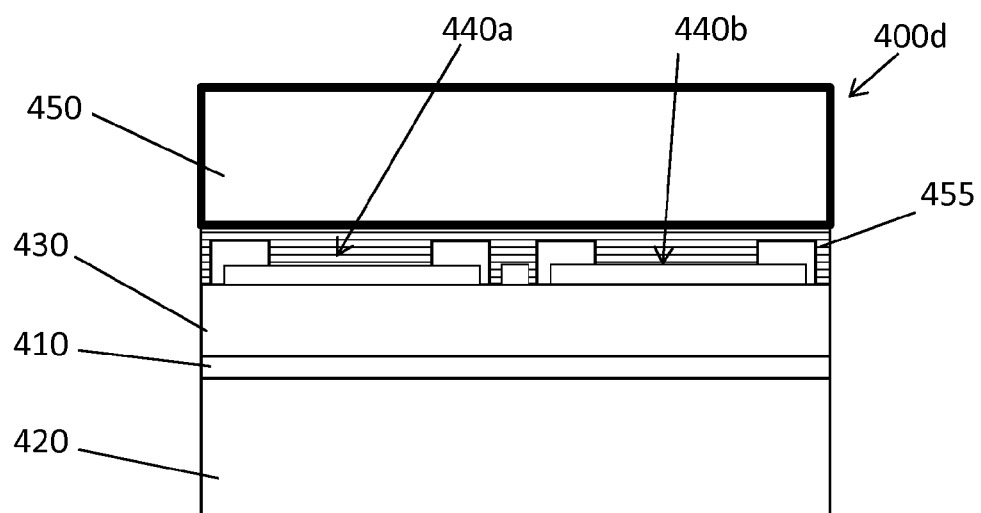

In embodiments, such as FIG. 4D, the second carrier 450 can be attached with an adhesive 455. The adhesive can be any suitable bonding agent or material such as glue, in one example.

In FIG. 3, after attaching a second carrier, at 325 the first carrier can be removed. The first carrier can be removed using any suitable method including, for example, mechanical thinning, removal or destruction of any adhesives bonding the carrier 420 to the thin layer 410, or other suitable methods. With regard to adhesive removal/destruction, techniques including application of wet chemistry or temperature treatment (e.g., applying heat to at least the adhesive bonding the second carrier to structure), may be used.

In some exemplary embodiments, the semiconductor layer may be removed. The semiconductor layer may be removed, for example, in a separate process, subsequent to removal of the first carrier. Alternatively, the semiconductor layer can be removed together with the first carrier, for example in a single process, at the same or substantially same time. Any suitable technique may be implemented for such removal. Referring to FIG. 4D, the thin layer 410 and the carrier 420 may both be removed. In one example, separation of the thin layer 410 from the device layer 430 can cause the thin layer 410 as well as the carrier 420 to become separated from the rest of the structure 400d.

Figures 1, 4E:
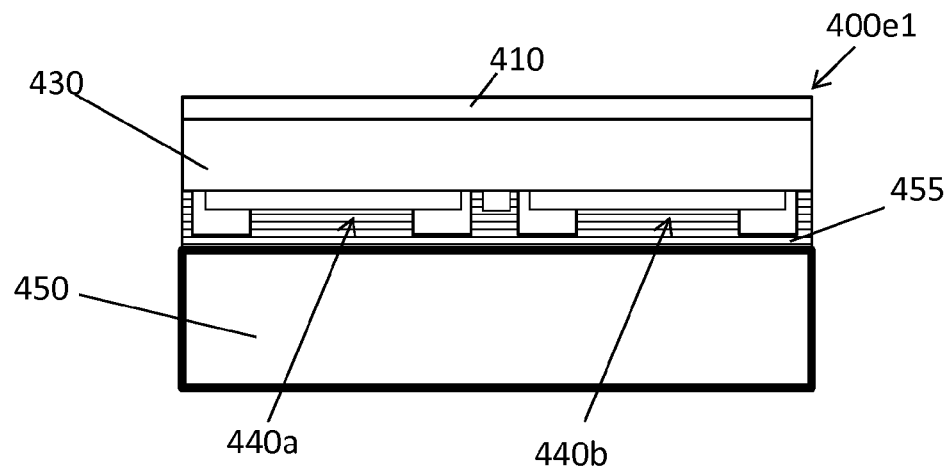

FIG. 4E-1 depicts a structure 400e1, in which the first carrier 420 has been removed from the structure 400d. As previously noted, the components of the structure 400e, e.g., thin layer 410, device layer 430, etc. can rely on the mechanical stability provided by the second carrier 450 to prevent mechanical stress or breakage.

Figures 2, 4E:
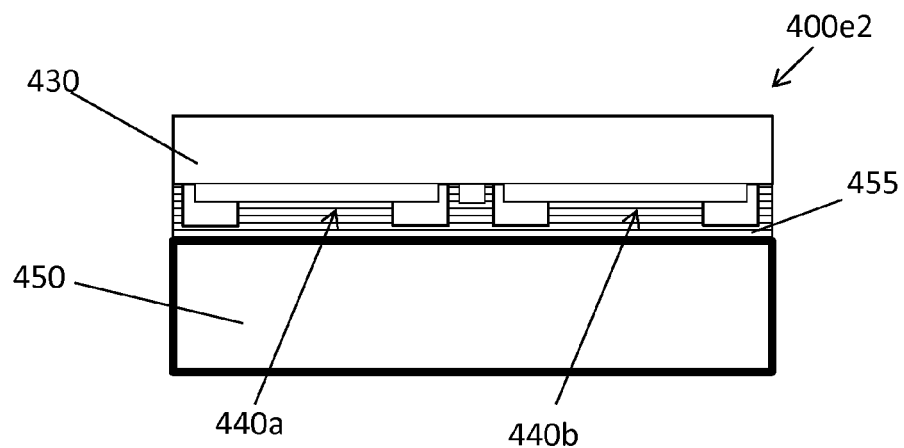

FIG. 4E-2 depicts structure 400e2, in which the first carrier 420 as well as the semiconductor layer 410 has been removed from the structure 400d.

Referring back to FIG. 3, at 330, a metallization layer can be formed over a side of the device layer facing away from the second carrier. In embodiments, the metallization layer may be applied to the semiconductor layer or thin layer, to the extent it exits, on a side of the semiconductor layer facing away from the second carrier. Alternatively the metallization layer may be applied to the device layer, for example on a side of the device layer facing away from the second carrier. For example, in the embodiment of FIG. 4F-1, structure 400f1 includes a metallization layer 460 formed on or attached to the backside of the thin layer 410.

Figures 1, 4F:
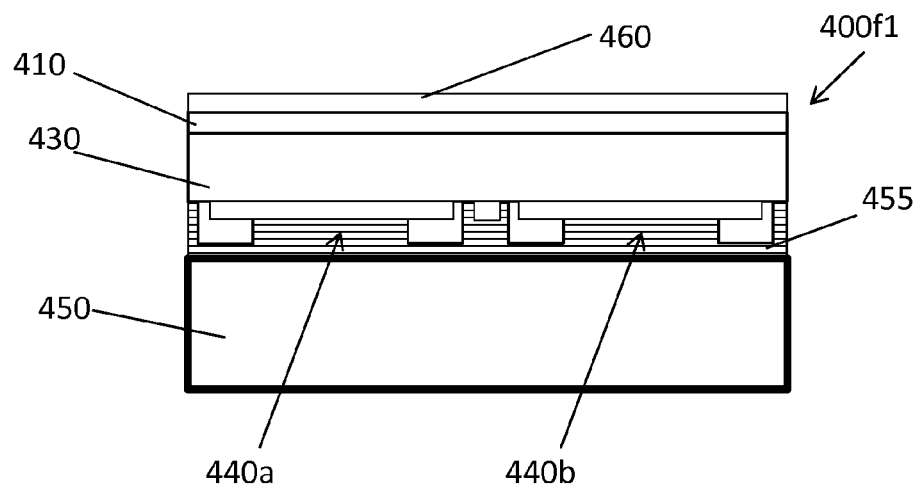
Figures 2, 4F:
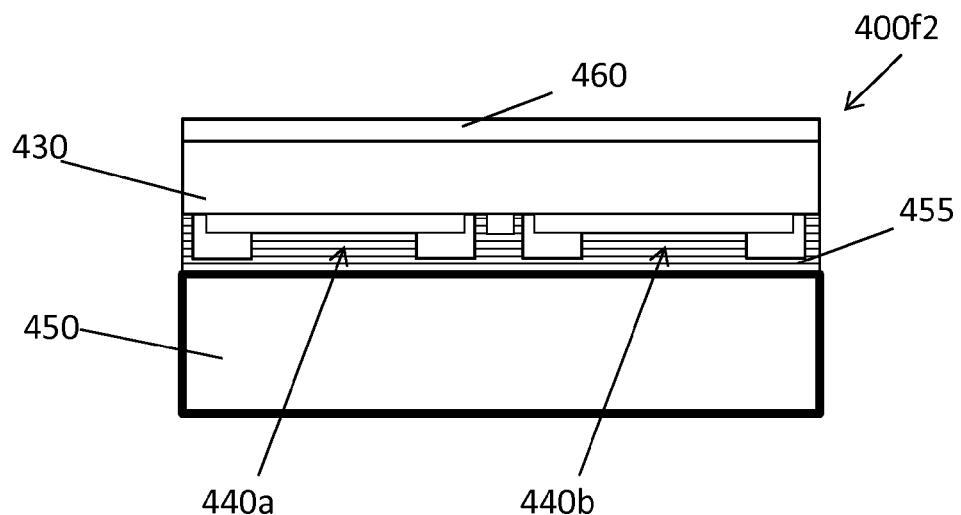

In the embodiment of FIG. 4F-2, the carrier 420 and the thin layer 410 of structure 400f2 have been removed, and the metallization layer 460 can be formed on or attached to the device layer 430.

The metallization layer 460 (e.g., of FIG. 4F-1, 4F-2, etc.) can include one or more metals which provide good ohmic contact to the thin layer 410. Suitable metals include, for example, Ni, Mo, W, Ta, Nb, Ti, Cr, Al, Cu, V, and combinations thereof, to name a few.

Variations of embodiments, such as those with respect to FIG. 3 (e.g., 335-345) and FIGS. 4E-4I, may be realized and/or implemented with or without the thin layer 410.

Figure 4G:
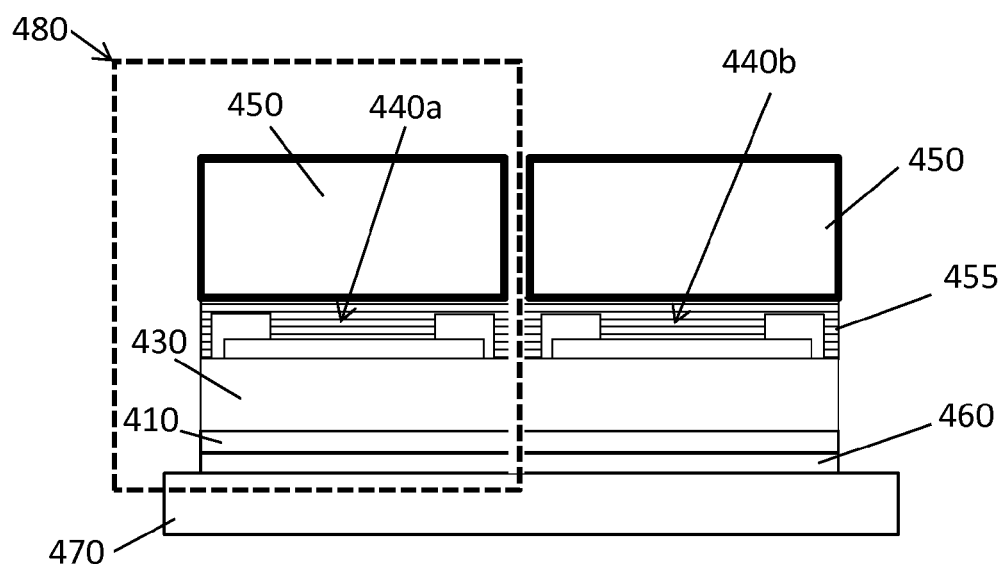

In accordance with exemplary embodiments, structures resulting from the embodiment described in FIG. 3 such as, for example, structures 400/1 and 400/2 of FIG. 4F can be processed further. For example, referring to FIG. 3, at 335, the structure, e.g., the metallization layer, semiconductor layer (in cases where it has not been removed), the device layer, and the second carrier can be diced to form at least one individual or singulated semiconductor chip. In accordance with exemplary embodiments, the structures 400/1 and/or 400/2 can be separated or diced, such as along one or more kerf regions. In the embodiment of FIG. 4G, the structure 400/1 has been mounted on a foil 470 and diced. As shown, one or more individual semiconductor chips, such as chip 480, are formed as a result of dicing.

In accordance with exemplary embodiments, any suitable dicing or separation technique can be used, such as, for example, mechanical sawing, stealth dicing, laser dicing, and plasma etching, to name a few.

In accordance with exemplary embodiments, the second carrier, or the carrier layer attached to the device layer can be transparent or at least substantially transparent. Carrier transparency may help facilitate dicing or sawing by providing at least some visibility of the components attached to the carrier.

Figure 4H:
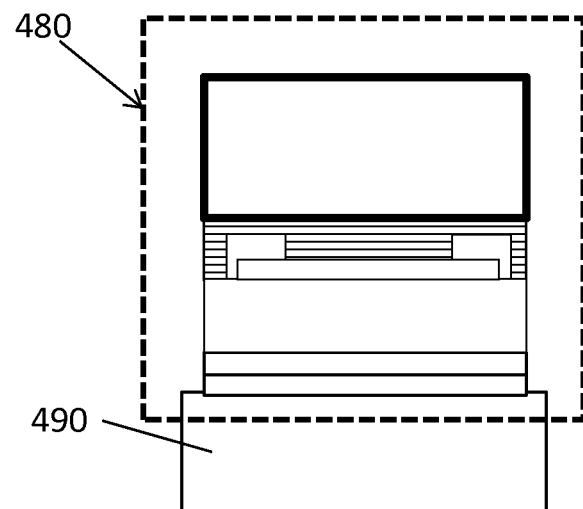

At 340 in FIG. 3, one or more of the formed or separated semiconductor stacks are mounted, on a third carrier. In other words, one or more of the formed or separated semiconductor stacks may be mounted on a third carrier. In embodiments, the third carrier may be, for example, an electrically conductive carrier, e.g., a lead frame. As shown in the embodiment of FIG. 4H, one of the semiconductor chips 480 is mounted and attached to a lead frame 490.

Figure 4I:
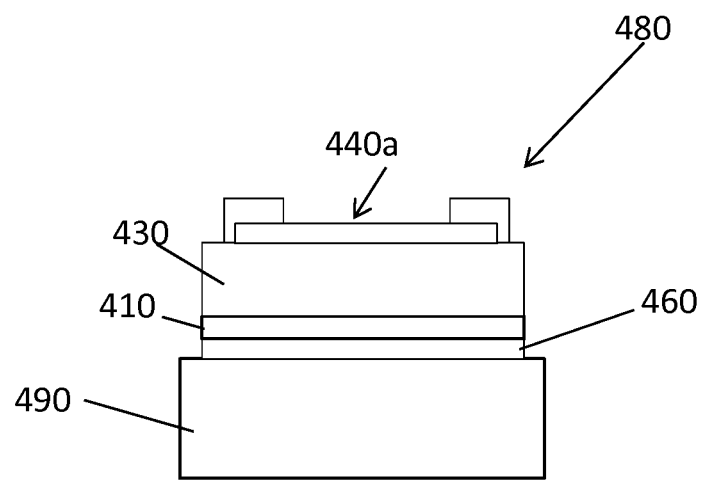

Referring back to FIG. 3, after mounting, then at 345 the second carrier from the mounted semiconductor chip may be removed. For example, FIG. 4I shows a mounted semiconductor chip 480. As shown in FIG. 4I the second carrier 450 has been removed.

In embodiments, the second carrier 450 can be removed by removing or destroying the adhesive 455. The adhesive 455 can be removed or destroyed using wet chemistry techniques, by temperature treatment (e.g., application of heat to at least the adhesive), and/or by any other suitable methods.

As a result of the carrier removal, a substrateless semiconductor chip 480 mounted on a lead frame 490 can be provided.

Alternatively in some embodiments a semiconductor workpiece can be processed so as to include a replacement or artificial substrate.

Figure 5:
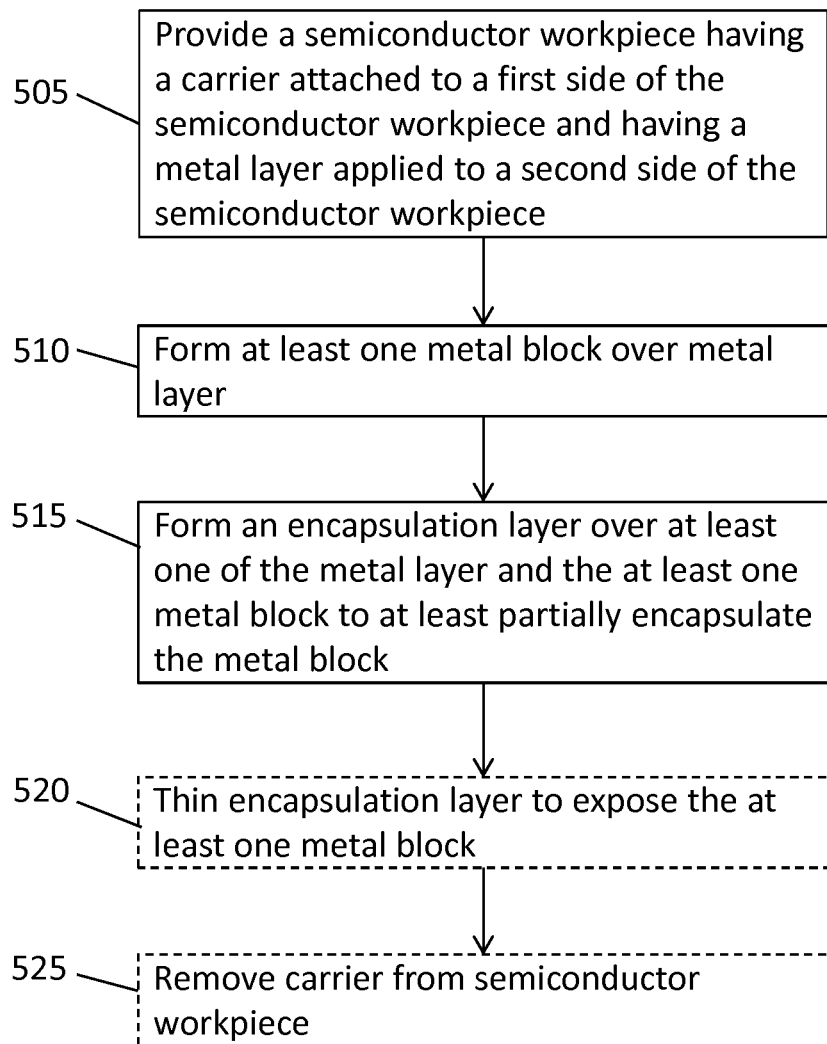
FIG. 5 shows a method for producing a semiconductor device in accordance with various embodiments.

FIG. 5 shows, according to an exemplary embodiment, a method for producing a semiconductor device. A provided structure can at least include a semiconductor workpiece attached to a carrier.

Figure 6A:
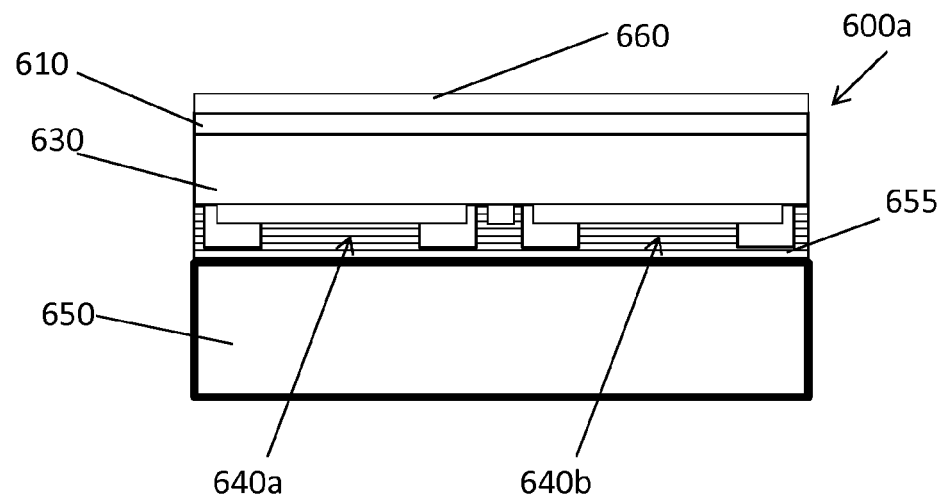
FIGS. 6A-6F show various views illustrating a process involving a semiconductor workpiece in accordance with various embodiments.

In FIG. 5, at 505, a semiconductor workpiece is provided having a carrier attached to a first side of the workpiece and having a metal layer applied to a second side of the semiconductor workpiece. In one example, one such structure can be a semiconductor structure produced according to steps 305-330 of FIG. 3. In other words, the semiconductor workpiece may include a semiconductor layer having a device layer, e.g., an epitaxial layer, formed on a front side of the semiconductor layer. In this regard the metal layer may be formed on a backside of the semiconductor layer, and the carrier attached to the device layer, e.g., epitaxial layer. FIG. 6A depicts a cross-sectional view of one such structure, structure 600a. In the exemplary embodiment of FIG. 6A the structure 600a includes a semiconductor layer 610 (e.g., a thin semiconductor layer or substrate), a device layer 630, and a carrier 650. Further, the structure 600a may include a metal layer 660 attached to the backside of the semiconductor layer 610. The device layer 630 can include one or more semiconductor devices, e.g., 640a, 640b. The device layer 630 can be disposed on the front side of the semiconductor layer 610. The carrier layer 650 can be bonded to the front side of the structure 600a with an adhesive 655.

Of course other structures or variations can be provided in accordance with exemplary embodiments. For example, the workpiece may include other layers such as substrate layers, device layers, insulating layers, etc.

Referring to FIG. 5, at 510, at least one metal block can be formed over the metal layer. For example, the at least one metal block can be applied and/or formed on a backside of the provided workpiece, on the metal layer. The metal block or blocks or other suitable supporting elements can be attached or adhered to the backside of the provided semiconductor structure.

The applied metal blocks may include other elements and/or layers, such as one or more metallization layers and/or copper pads. For example, referring to the embodiment of FIG. 6B, a cross sectional view of one exemplary structure 600b is shown. As shown, the structure 600b includes one or more metal blocks 690. The metal blocks 690 can include one or more base layers 635. In embodiments, such base layers 635 can be made of metal, such as copper, that can be applied or deposited on the backside of the metal layer 660. The layers 635 may be patterned appropriately, using any suitable technique.

Figure 6B:
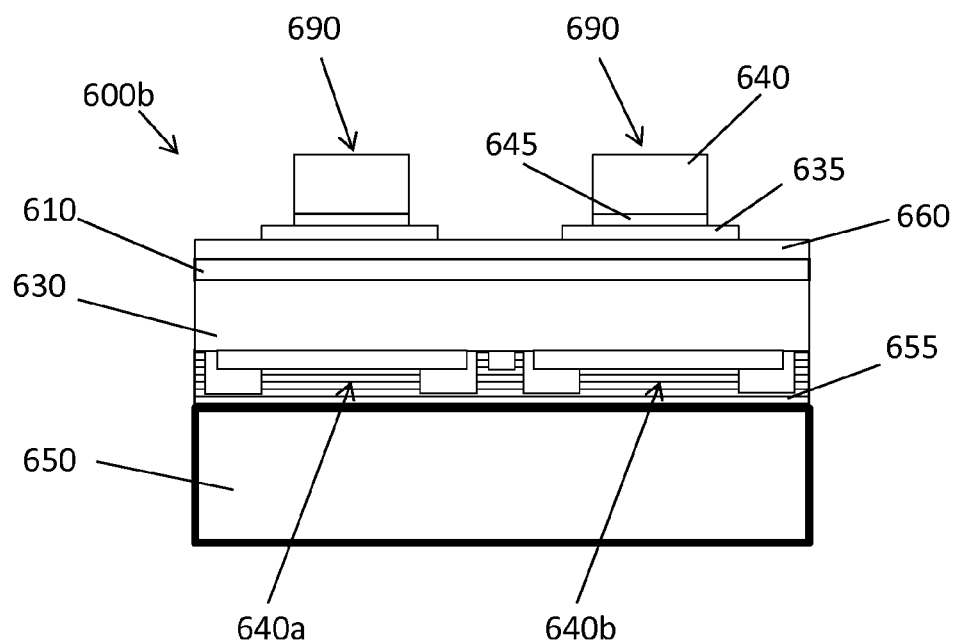

Further, as shown in FIG. 6B, the one or more metal blocks 690 may each include one or more metal pads 640. The one or more metal pads 640 can be applied to the one or more base layers 635. The metal pads 640 can include a covering layer 645 formed on a side of the metal pads 640. As shown in FIG. 6B, the covering layer 645 can be located between the metal pads 640 and the base layers 635.

In accordance with exemplary embodiments, the metal pads 640 can consist of one or more metals including copper, in one example. In one or more embodiments, the metal pads may be in the shape of a block or any other appropriate shape. The covering layer 645 can be made of tin, silver, and/or any other suitable materials.

The metal pads 640, the covering layers 645, and the base layers 635 may attach to one another through any suitable means, such as, for example, soldering, e.g. soft soldering, diffusion soldering, and the like, to name a few.

Figures 1, 6C:
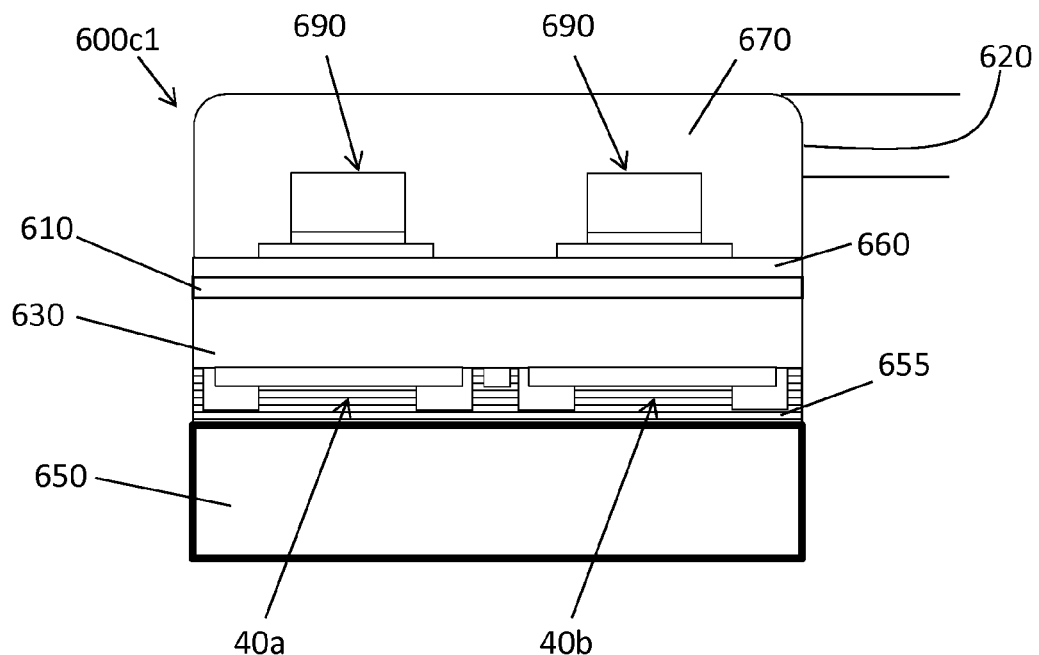
Figures 2, 6C:
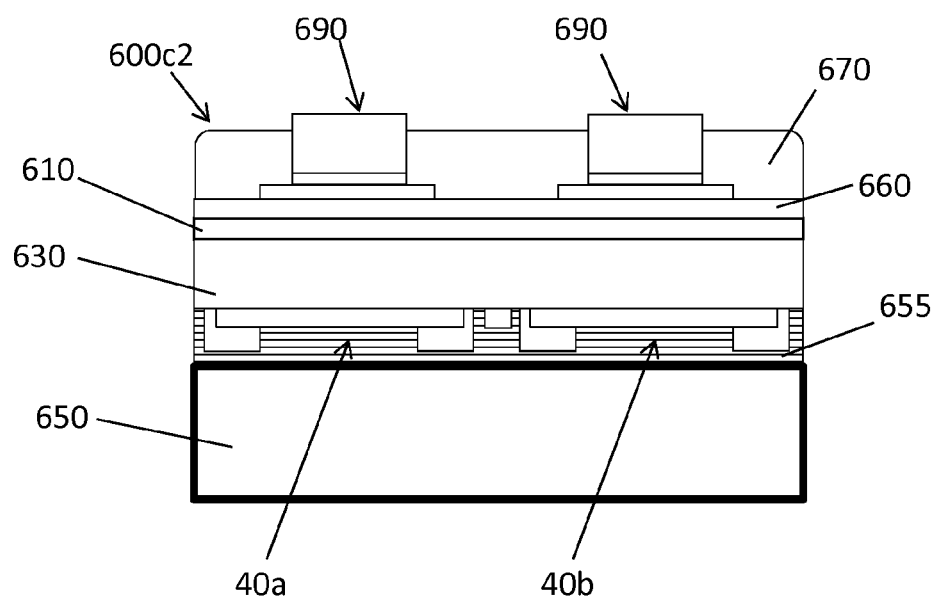

Referring to FIG. 5, at 515, an encapsulation layer can be formed over at least one of the metal layer and/or over the at least one metal block so as to at least partially encapsulate the at least one metal block. In exemplary embodiments, the encapsulation layer may be molding material that is added and hardened on the workpiece. For example, the embodiment of FIG. 6C-1 shows a structure 600c1 including a molding 670 that is formed on and over the metal blocks 690 and over the metal layer 660, while in the embodiment of FIG. 6C-2, a structure 600c2 is shown that includes a molding 670 that is formed over and on the metal layer 660, but not over or above the metal blocks 690. In the embodiment of FIG. 6C-2, a top surface of the molding 670 may be at a lower level than the ends of the metal blocks 690, as shown, or it may be level or at least substantially level with the end(s) of at least one (e.g. all) of the metal blocks 690.

Figure 6D:
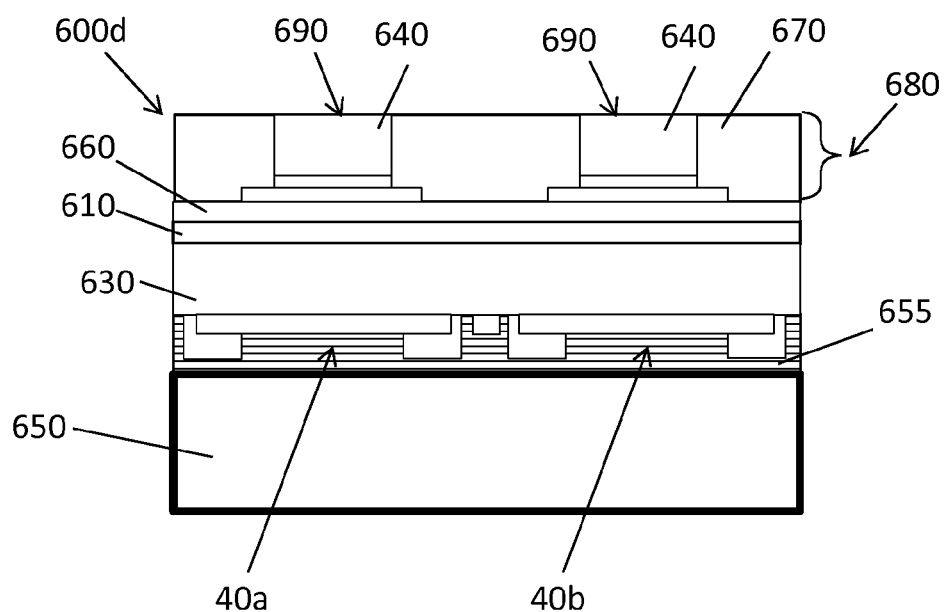

Optionally, as shown in FIG. 5, after the encapsulation layer has been formed, the encapsulation may be thinned. In other words, excess encapsulation material or sections thereof, to the extent it exists, may be removed, so as to expose one or more metal blocks, at 520. For example, in FIG. 6C-1, excess molding 620, a section of the molding 670 located between the set of parallel lines, can be removed to at least partially expose the metal blocks 690. Accordingly the embodiment of FIG. 6D shows a corresponding structure 600d, in which the excess molding 620 has been removed. Further, FIG. 6D depicts that the excess molding 620 has been removed in an even or substantially even manner. The molding 670 can be approximately level with the ends of the metal blocks 690 leaving at least a section of a surface of the metal blocks 690 exposed. In some embodiments the molding 670 may be thinned to a level below the ends of the metal blocks 690.

In accordance with exemplary embodiments, excess encapsulation material, e.g., excess molding, can be removed using any suitable technique such as grinding, chemical mechanical polishing (CMP), wet chemistry techniques, plasma etching, to name a few.

After the removal of excess encapsulation layer, the remaining encapsulation layer together with the metal blocks can form or act as a wafer or an "artificial substrate". This artificial substrate may provide mechanical stability to the resulting structure. For example in FIG. 6D, the structure 600d includes the artificial substrate 680. The artificial substrate 680 can provide sufficient stability to allow the structure 600d to be handled and/or flipped.

Figure 6E:
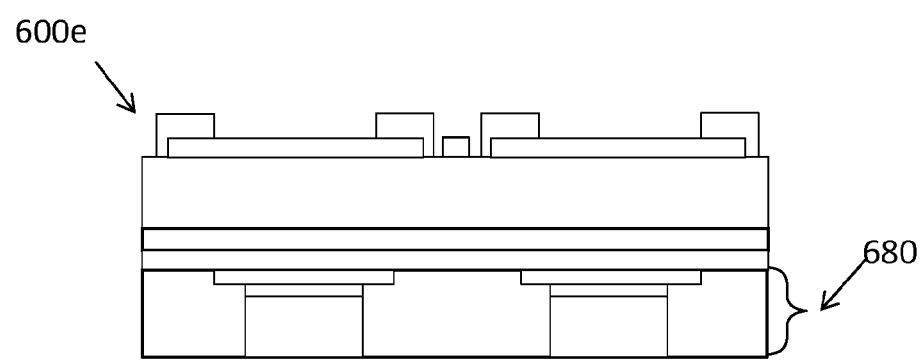

Optionally, as shown in FIG. 5, with the artificial substrate developed and formed, the carrier can be removed. According to the exemplary embodiment of FIG. 5, at 525, the carrier can be removed. The carrier may be removed using any suitable technique, including any of aforementioned techniques previously described herein. FIG. 6E shows an embodiment depicting a structure 600e including the artificial substrate 680 without the carrier 650.

After carrier removal, the resulting structures, such as structure 600e may be further processed in accordance with exemplary embodiments. In one example, the structure 600e may be laminated and mounted to another carrier, such as a lead frame.

In another example, the structure 600e, or any other equivalent structure may be subjected to wafer separation, e.g., wafer dicing, so as to form one or more individual or separate semiconductor chips. In some embodiments, wafer separation may be implemented before or after carrier removal. For example, wafer separation can be implemented before or after the addition of metal blocks, before or after the application of encapsulation layer, before or after the removal of excess encapsulation layer material, etc.

Figure 6F:
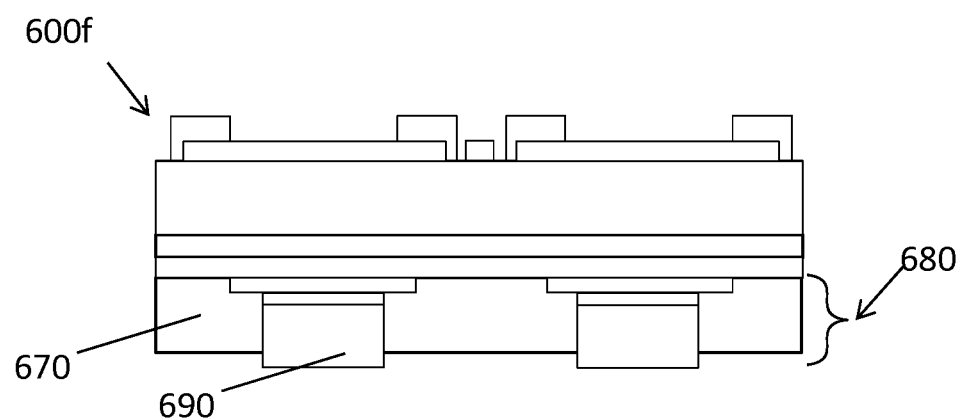

Please note that while the embodiments of FIGS. 6D and 6E show structures having the artificial substrate 680 having the molding layer 670 even or level with the metal blocks 690, this is not necessarily so. As explained with respect to FIG. 6C the artificial substrate 680 may be formed with the molding layer 670 thinner or not at the same level with the ends of the metal blocks 690. This may be due to thinning, or may be due to amount of molding applied. For example, the embodiment of FIG. 6F shows a structure 600f similar to the structure 600e, but with the molding layer 670 of the artificial substrate 680 being below the ends of metal blocks 690.

In accordance with exemplary embodiments, the thicknesses of the artificial substrate 680, e.g. of the one or more metal blocks 690 and the corresponding encapsulation layer 670 after thinning, can be about 50 μm to 1 mm, e.g. 50 μm to 100 μm, 100 μm to 500 μm, or 500 μm to 1 mm, to name a few.

In accordance with exemplary embodiments, the at least one metal block may have a lateral dimension, e.g., a diameter, e.g., a length and/or width in the range from about 500 μm to about 3 cm.

Various embodiments herein describe semiconductor structures manufactured with a thin semiconductor layer or substrate. For example, thin semiconductor layers disposed on a substrate can be provided using SMART cut technology processes, one of which is briefly described with respect to the embodiments depicted in reference to FIGS. 7A-7E.

Figure 7A:
FIGS. 7A-7E show various views illustrating a process involving a semiconductor workpiece in accordance with various embodiments.
Figure 7B:
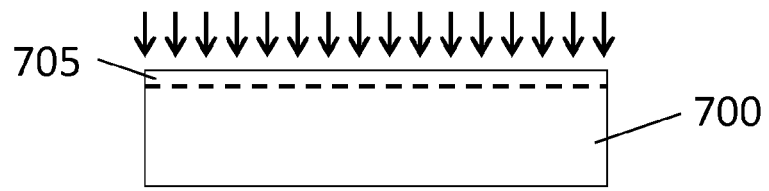
Figure 7C:
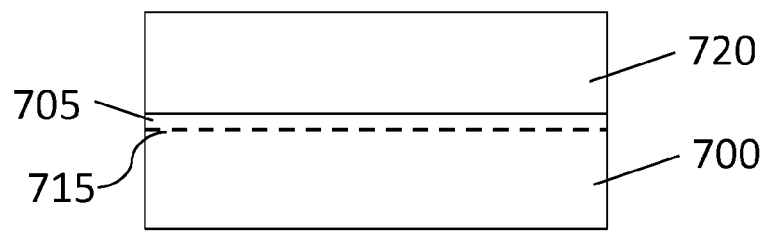

In FIG. 7A a semiconductor substrate wafer 700, including or consisting of a semiconductor such as silicon, silicon carbide, etc. is provided. The substrate wafer 700 may be relatively thick in comparison to a needed or targeted thin semiconductor layer. Next, as shown in FIG. 7B, the substrate wafer 700 is implanted with ions, such as hydrogen ions or the like. In this regard, a surface of the substrate wafer 700 can be implanted with ions so as to form a weak region 715 in a predetermined depth of the wafer 700. The weak region 715 may separate a thin surface layer 705 of the wafer 700 from the bulk of the wafer 700. After implantation, the substrate wafer 700 can be bonded to a second wafer 720. The surface of substrate wafer 700 implanted with ions can be attached to the second wafer 720, as seen in FIG. 7C. In particular, the second wafer 720 can be attached to the surface layer 705. The second wafer 720 can include any suitable substrate material such as graphite, in one example.

Figure 7D:
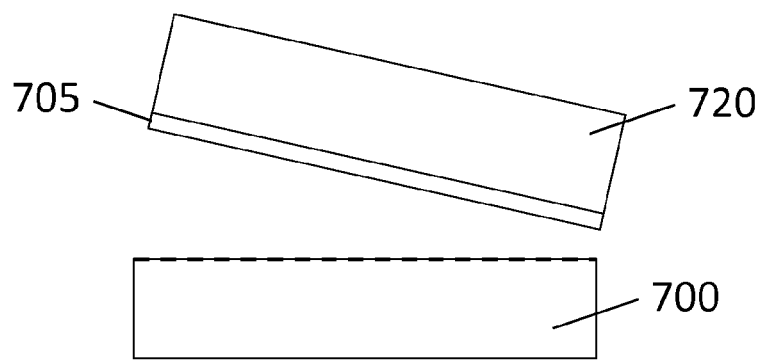
Figure 7E:
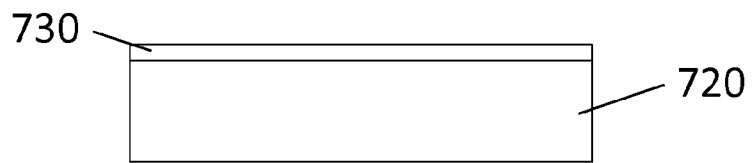

After bonding the substrate wafer 700 to the second wafer 720, the first substrate 700 can be separated along the weak region 715. As shown in the embodiment of FIG. 7D, the substrate wafer 700 can be separated so that the surface layer 705 and the second wafer 720 together are separated from the remainder of the substrate 700. As a result a thin semiconductor layer 730, corresponding to the surface layer 705, is provided on the second wafer 720, as seen in the embodiment of FIG. 7E. The remainder of the first substrate 700 may be used again to form additional thin semiconductor layers.

According to exemplary embodiments, thin semiconductor layers may be produced from other techniques, including in one example from mechanical thinning e.g., grinding of thicker semiconductor substrates.

According to exemplary embodiments, a thin semiconductor layer can be provided on a substrate by doping a portion or section of the substrate. The doped section or part of the substrate can correspond to a thin semiconductor layer having a high doping concentration, while the remainder of the substrate has a lower doping concentration and can act as a substrate.

An aspect of various embodiments described herein may relate to methods for the reduction of substrate related parasitic by the use of layer transfer techniques instead of the use of mechanical thinning. In some embodiments, this may be accomplished through the replacement of an original substrate by an artificial substrate that has improved electrical and/or thermal properties relative to the original substrate.

In some embodiments, reduction of substrate related parasitic by the use of layer transfer techniques may be accomplished by die attaching a substrateless device to a temporary carrier.

A method for producing a semiconductor device in accordance with various embodiments may include providing a semiconductor workpiece attached to a carrier; dicing the semiconductor workpiece and the carrier so as to form at least one individual semiconductor chip; mounting the at least one semiconductor chip with a side facing away from the carrier, to an additional carrier.

In accordance with one or more embodiments, the method further includes removing the carrier from the mounted at least one semiconductor chip.

In accordance with one or more embodiments, the semiconductor workpiece includes a semiconductor layer and a device layer.

In accordance with one or more embodiments, the semiconductor layer has a thickness of less than or equal to about 100 μm.

In accordance with one or more embodiments, the semiconductor layer has a thickness in the range of about 5 μm to about 15 μm.

In accordance with one or more embodiments, the semiconductor layer has a thickness in the range of about 2 μm to about 5 μm.

In accordance with one or more embodiments, the semiconductor layer has a thickness in the range of about 15 μm to about 100 μm.

In accordance with one or more embodiments, the semiconductor layer includes or is made of silicon carbide.

In accordance with one or more embodiments, the device layer includes one or more semiconductor devices. In one or more embodiments, the device layer is an epitaxial layer.

In accordance with one or more embodiments, the device layer includes or is made of silicon carbide.

In accordance with one or more embodiments, the semiconductor layer is more highly doped than the device layer.

In accordance with one or more embodiments, the semiconductor layer is formed through a SMART cut process.

In accordance with one or more embodiments, the carrier is substantially transparent.

In accordance with one or more embodiments, the carrier is made of glass, or plastic.

In accordance with one or more embodiments, the carrier is bonded to the semiconductor workpiece with a glue.

In accordance with one or more embodiments, the semiconductor workpiece has a thickness of less than or equal to about 100 μm, for example 2 μm to 5 μm, 5 μm to 10 μm, 5 μam to 15 μm, 15 μm to 100 μm, or 1 μm to 100 μm, to name a few.

In accordance with one or more embodiments, the additional carrier is an electrically conductive carrier, for example, a lead frame.

In accordance with one or more embodiments, dicing the semiconductor workpiece and the carrier comprises at least one or more of sawing, laser dicing, plasma dicing, and stealth dicing.

A method for producing a semiconductor device in accordance with various embodiments may include: providing a semiconductor layer disposed on a first carrier; forming a device layer on the semiconductor layer, forming one or more semiconductor devices with at least one semiconductor device formed on or in the device layer; applying a second carrier to the device layer; removing the first carrier; applying a metal layer over a side of the device layer facing away from the second carrier; dicing the metal layer, the device layer, and the second carrier so as to form at least one individual semiconductor chip; mounting the at least one individual semiconductor chip on a third carrier; and removing the second carrier from the at least one mounted individual semiconductor chip.

In accordance with at least one exemplary embodiment, the method for producing a semiconductor device can further include removing the semiconductor layer before applying the metal layer.

In accordance with at least one exemplary embodiment, the semiconductor layer and the first carrier can be removed simultaneously.

In accordance with at least one exemplary embodiment, the semiconductor layer can be removed after the first carrier has been removed.

In accordance with at least one exemplary embodiment, applying the metal layer over a side of the device layer includes applying the metal layer to the semiconductor layer.

In accordance with at least one exemplary embodiment, applying the metal layer over a side of the device layer includes applying the metal layer to a side of the semiconductor layer facing away from the second carrier.

In accordance with at least one exemplary embodiment, applying the metal layer over a side of the device layer includes applying the metal layer to the device layer.

In accordance with at least one exemplary embodiment, applying the metal layer over a side of the device layer includes applying the metal layer to a side of the device layer facing away from the second carrier.

In accordance with at least one exemplary embodiment, the third carrier is an electrically conductive carrier.

In accordance with at least one exemplary embodiment, the third carrier is a lead frame.

In accordance with at least one exemplary embodiment, the semiconductor layer is a thin semiconductor layer.

In accordance with at least one exemplary embodiment, the semiconductor layer has a thickness of less than or equal to about 100 μm.

In accordance with at least one exemplary embodiment, the semiconductor layer has a thickness in the range of about 5 μm to about 15 μm.

In accordance with at least one exemplary embodiment, the semiconductor layer has a thickness in the range of about 15 μm to about 100 μm.

In accordance with at least one exemplary embodiment, the semiconductor layer has a thickness in the range of about 2 μm to about 5 μm.

In accordance with at least one exemplary embodiment, dicing the metal layer, the semiconductor layer, the device layer, and the second carrier is performed through sawing.

In accordance with at least one exemplary embodiment, sawing includes applying a sawing foil to the metal layer.

In accordance with at least one exemplary embodiment, the thin semiconductor layer includes at least one of silicon carbide and gallium nitride.

In accordance with at least one exemplary embodiment, forming the device layer includes forming an epitaxial layer on the semiconductor layer.

In accordance with at least one exemplary embodiment, the epitaxial layer includes silicon carbide.

In accordance with at least one exemplary embodiment, the semiconductor layer is more highly doped than the epitaxial layer.

In accordance with at least one exemplary embodiment, the semiconductor layer is formed on the first carrier through a SMART cut process.

In accordance with at least one exemplary embodiment, the second carrier is substantially transparent.

In accordance with at least one exemplary embodiment, the second carrier includes glass.

In accordance with at least one exemplary embodiment, the second carrier includes plastic.

In accordance with at least one exemplary embodiment, the second carrier is bonded to the device layer with a glue.

In accordance with at least one exemplary embodiment, removing the second carrier includes applying heat at least to an adhesive bonding the second carrier to the device layer.

In accordance with at least one exemplary embodiment, removing the second carrier includes applying wet chemistry to the glue bonding the second carrier to the device layer.

A method for producing a semiconductor device in accordance with various embodiments may include providing a semiconductor structure comprising: a semiconductor layer; an epitaxial layer formed on a front side of the semiconductor layer; a metallization layer formed on the back side of the semiconductor layer; a carrier layer attached to the epitaxial layer; applying a sawing foil to the metallization layer of the stack; dicing the structure to form one or more individual semiconductor chips; mounting at least one of the individual semiconductor chips to a lead frame; and removing the carrier layer from the at least one mounted individual semiconductor chip.

In accordance with at least one exemplary embodiment, dicing the structure comprises sawing.

In accordance with at least one exemplary embodiment, the method further includes applying a sawing foil to the metallization layer of the structure before sawing.

In accordance with at least one exemplary embodiment, the semiconductor layer includes or is made of silicon carbide.

In accordance with at least one exemplary embodiment, the epitaxial layer includes or is made of silicon carbide with a lower doping than the thin semiconductor layer.

In accordance with at least one exemplary embodiment, the semiconductor layer has a thickness of about 5 µm to about 15 µm.

A method for producing a semiconductor device in accordance with various embodiments may include providing a semiconductor workpiece having a carrier attached to a first side of the semiconductor workpiece and having a metal layer applied to a second side of the semiconductor workpiece; forming at least one metal block over the metal layer; forming an encapsulation layer over at least one of the metal layer and the at least one metal block to at least partially encapsulate the at least one metal block.

In accordance with one or more embodiments, the method further includes removing the carrier from the semiconductor workpiece after forming the encapsulation layer.

In accordance with one or more embodiments, forming the encapsulation layer over at least one of the metal layer and the at least one metal block includes forming the encapsulation layer over the metal layer and the at least one metal block, and the method further includes thinning the encapsulation layer to expose the at least one metal block.

In accordance with one or more embodiments, the method further includes removing the carrier from the semiconductor workpiece after thinning the encapsulation layer.

In accordance with at least one exemplary embodiment, metal block includes copper.

In accordance with at least one exemplary embodiment, the encapsulation layer is a mold compound.

In accordance with at least one exemplary embodiment, thinning the encapsulation layer includes grinding the encapsulation layer.

A method for producing a semiconductor device in accordance with various embodiments may include providing a stack including: a thin semiconductor layer; an epitaxial layer formed on a front side of the thin semiconductor layer and includes one or more semiconductor devices; a metal layer formed on a back side of the thin semiconductor layer; a carrier layer attached to the epitaxial layer; forming on the metal layer, at least one metal block; applying a molding layer over the least one metal block and the metal layer; thinning the molding layer to expose the at least one metal block; and removing the carrier layer from the stack.

In accordance with at least one exemplary embodiment, the metal block includes copper.

In accordance with at least one exemplary embodiment, the method may further include dicing the stack to form one or more individual semiconductor chips.

In accordance with one or more embodiments, dicing the stack may include applying a sawing foil to the metal layer.

In accordance with at least one exemplary embodiment, the method may further include mounting the stack on a lead frame.

In accordance with at least one exemplary embodiment, the metal block includes a copper pad covered with a metal layer including tin or silver.

In accordance with at least one exemplary embodiment, the thin semiconductor layer is silicon carbide.

In accordance with at least one exemplary embodiment, the epitaxial layer includes or is made of silicon carbide.

In accordance with at least one exemplary embodiment, the thin semiconductor layer has a thickness of about 5 µm to about 15 µm.

In accordance with at least one exemplary embodiment, thinning the molding layer includes grinding the molding layer down to the metal block.

While various aspects of this disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method for producing a power semiconductor device, the method comprising:
    providing a semiconductor workpiece attached to a carrier, the semiconductor workpiece comprising a semiconductor wafer including one or more kerf regions;
    dicing the semiconductor workpiece and the attached carrier so as to form at least one individual power semiconductor chip, wherein the semiconductor wafer is diced at the one or more kerf regions and the semiconductor workpiece comprises at least silicon carbide;
    mounting the at least one power semiconductor chip with a side facing away from the carrier, to an additional carrier; and
    removing the carrier from the mounted at least one power semiconductor chip.

2. The method of claim 1, wherein the semiconductor workpiece comprises a semiconductor layer and a device layer.

3. The method of claim 2, wherein the semiconductor layer has a thickness of less than or equal to about 100 µm.

4. The method of claim 2, wherein the device layer is an epitaxial layer.

5. The method of claim 4, wherein the device layer comprises at least one of silicon carbide and gallium nitride.

6. The method of claim 2, wherein the semiconductor layer is formed through a SMART cut process.

7. The method of claim 1, wherein the carrier is substantially transparent.

8. The method of claim 1, wherein the semiconductor workpiece has a thickness of less than or equal to about 100 µm.

9. The method of claim 1, wherein the additional carrier is an electrically conductive carrier.

10. A method for producing a power semiconductor device, the method comprising:
   providing a semiconductor workpiece attached to a carrier, the semiconductor workpiece comprising a semiconductor wafer including one or more kerf regions, wherein the carrier includes glass, graphite, plastic, or metal;
   dicing the semiconductor workpiece and the attached carrier so as to form at least one individual power semiconductor chip, wherein the semiconductor wafer is diced at the one or more kerf regions and the semiconductor workpiece comprises at least silicon carbide; and
   mounting the at least one power semiconductor chip with a side facing away from the carrier, to an additional carrier.

11. The method of claim 10, wherein the carrier is a metal carrier, a metal plate, a copper plate, an aluminum plate, a copper wafer, or an aluminum wafer.

* * * * *